(12) United States Patent
Kiso et al.

(10) Patent No.: US 6,762,508 B1
(45) Date of Patent: Jul. 13, 2004

(54) SEMICONDUCTOR ENCAPSULANT RESIN HAVING AN ADDITIVE WITH A GRADIENT CONCENTRATION

(75) Inventors: Shigeo Kiso, Kyotanabe (JP); Ichiro Kataoka, Kyotanabe (JP); Satoru Yamada, Nara (JP); Hidenori Shiotsuka, Kyotanabe (JP); Hideaki Zenko, Kyotanabe (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/256,227

(22) Filed: Feb. 24, 1999

(30) Foreign Application Priority Data

Feb. 27, 1998 (JP) ............................................. 10-047001
Feb. 22, 1999 (JP) ............................................. 11-042912

(51) Int. Cl.[7] ............................................. H01L 23/28
(52) U.S. Cl. ....................... 257/787; 257/788; 257/792; 257/795; 136/251; 136/259
(58) Field of Search ................................. 257/787–795, 257/655; 136/251–252, 256, 258–259

(56) References Cited

U.S. PATENT DOCUMENTS

| | | | |
|---|---|---|---|
| 3,916,073 A | 10/1975 | Horowitz et al. | 428/451 |
| 5,357,015 A | 10/1994 | Haruvy et al. | 528/10 |
| 5,421,909 A | 6/1995 | Ishikawa et al. | 136/256 |
| 5,474,620 A | 12/1995 | Nath et al. | 136/251 |
| 5,482,571 A | 1/1996 | Yamada et al. | 136/259 |
| 5,530,264 A * | 6/1996 | Kataoka et al. | 136/259 |
| 5,582,653 A | 12/1996 | Kataoka et al. | 136/251 |
| 5,641,997 A * | 6/1997 | Ohta et al. | 257/788 |
| 5,650,019 A | 7/1997 | Yamada et al. | 136/251 |
| 5,656,098 A * | 8/1997 | Ishikawa et al. | 136/256 |
| 5,907,190 A * | 5/1999 | Ishikawa et al. | 257/795 |
| 6,097,100 A * | 8/2000 | Eguchi et al. | 257/787 |

FOREIGN PATENT DOCUMENTS

| | | |
|---|---|---|
| EP | 0641030 | 3/1995 |
| EP | 0658943 | 6/1995 |
| EP | 0680098 | 11/1995 |
| EP | 0784348 | 7/1997 |
| JP | 5-54277 | 2/1985 |
| JP | 62-273780 | 11/1987 |
| JP | 6-125103 | 5/1994 |
| JP | 6-318728 | 11/1994 |
| JP | 6-350117 | 12/1994 |
| JP | 7-297434 | 11/1995 |
| JP | 7-297439 | 11/1995 |
| JP | 8-306948 | 11/1996 |
| JP | 9-92848 | 4/1997 |

* cited by examiner

Primary Examiner—Kevin M. Picardat
(74) Attorney, Agent, or Firm—Fitzpatrick, Cella, Harper & Scinto

(57) ABSTRACT

Provided is an encapsulant resin for a semiconductor that effectively functions even with a relatively small amount of an additive.

The encapsulant resin for a semiconductor is characterized in that the additive has a concentration gradient in the direction of thickness of the encapsulant resin. Specifically, the concentration gradient of the additive is established in the direction of thickness of the encapsulant resin by stacking at least two types of organic polymer resins containing different contents of the additive to form the encapsulant resin or by applying an electric field to the encapsulant resin to effect electrophoresis of the polar additive in the encapsulant resin.

4 Claims, 2 Drawing Sheets

SEMICONDUCTOR ENCAPSULANT RESIN HAVING AN ADDITIVE WITH A GRADIENT CONCENTRATION

BACKGROUND OF THE INVENTION

1. Field of the Invention

The present invention relates to an encapsulant resin member for a semiconductor, and a semiconductor element encapsulated (sealed) by the use of the resin member and, more particularly, to a solar cell module in which a photovoltaic element is encapsulated by the use of the resin member.

2. Related Background Art

It is conventional practice to encapsulate a semiconductor element such as a photovoltaic element, a photodiode, or the like with a transparent encapsulant resin. For example, a solar cell module is normally constructed in such a structure that a photovoltaic element is encapsulated with an encapsulant resin between a front surface member and a back surface member.

The encapsulant resin is used for the purposes of filling unevenness of the surface of the photovoltaic element and bonding the element to the front surface member and to the back surface member and is usually a transparent, thermoplastic, organic polymer resin. Typical examples are polyvinyl butyral (PVB) and an ethylene-vinyl acetate copolymer (EVA). Among others, EVA is becoming rapidly widespread as an encapsulant resin for the photovoltaic elements, because it is inexpensive, easy to handle, capable of increasing heat resistance by crosslinking, high in durability against long-term outdoor exposure, and so on.

A variety of additives, such as a crosslinking agent, an ultraviolet absorbing agent, an oxidation inhibitor, a silane coupling agent, an adhesive, a reinforcing agent, and so on, are blended in the encapsulant resin in order to enhance the weather resistance, heat resistance, adhesion, impact resistance, etc. of the encapsulant resin. It is ordinary practice to blend these additives in the resin at the stage of producing an encapsulant resin member, for example, a sheet of the encapsulant resin, and they exist uniformly in the direction of thickness of the sheet.

The photovoltaic element is placed via this sheet of an encapsulant resin between the front surface member and the back surface member to form a solar cell module stack and the solar cell module stack is thermally compressed while being deaerated, to be laminated, thereby obtaining a solar cell module.

However, the inventors have found out that, because in the conventional process the concentrations of the additives in the encapsulant resin member were uniform in the direction of thickness of the encapsulant resin member, the additives more than necessary had to be blended in order to perform the aimed functions effectively. These excess additives are apt to be evaporated or decomposed readily by heat during the laminating operation of the photovoltaic element with the encapsulant resin member, so as to remain in the form of bubbles in the surface of the module. These remaining bubbles will degrade the appearance and will be the cause of decreasing the yield of the solar cell module. Further, hitherto, when the adhesion between the photovoltaic element and the encapsulant resin member was to be improved, it was conventional practice to directly coat the bonding surfaces with a silane coupling agent before the laminating operation with the encapsulant resin. Alternatively, when the front surface member such as glass sheet was bonded to the encapsulant resin member, it was conventional practice to directly coat the glass surface with a silane coupling agent before the laminating operation with the encapsulant resin.

SUMMARY OF THE INVENTION

For solving the above issue, the present invention provides an encapsulant resin member for a semiconductor having an additive dissolved therein such that the concentration of the additive has a gradient in the direction of thickness of the encapsulant resin member.

The present invention also provides a method of producing a semiconductor, comprising stacking on a surface of a semiconductor element at least two types of organic polymer resin members having different contents of an additive dissolved therein and encapsulating the semiconductor with the resin.

The present invention also provides a method of producing a semiconductor, comprising applying an electric field to an encapsulant resin member to effect electrophoresis of a polar additive dissolved in the encapsulant resin thereby establishing a concentration gradient of the additive in the direction of thickness of the encapsulant resin member and encapsulating a surface of a semiconductor with the encapsulant resin.

The present invention also provides a method of producing a solar cell module, comprising stacking on a surface of a photovoltaic element at least two types of organic polymer resin members having different contents of an additive dissolved therein and encapsulating the photovoltaic element with the resin.

The present invention also provides a method of producing a solar cell module, comprising applying an electric field to an encapsulant resin member to effect electrophoresis of a polar additive dissolved in the encapsulant resin thereby establishing a concentration gradient of the additive in the direction of thickness of the encapsulant resin member and encapsulating a surface of a photovoltaic element with the encapsulant resin.

The present invention also provides a semiconductor element encapsulated with an encapsulant resin, wherein an additive dissolved in the encapsulant resin has a concentration gradient in the direction of thickness of the encapsulant resin.

The present invention also provides a method of producing a semiconductor element encapsulated with an encapsulant resin, comprising providing an additive dissolved in the encapsulant resin with a concentration gradient in the direction of thickness of the encapsulant resin.

The following methods can be included as methods for establishing the concentration gradient of the additive in the direction of thickness of the encapsulant resin member. One method is a method of stacking at least two types of organic polymer resin members such as organic polymer resin sheets containing different contents of the additive, on a surface of a semiconductor element and encapsulating the semiconductor with the resin.

Another method is a method of applying an electric field to an encapsulant resin member to effect electrophoresis of a polar additive in the encapsulant resin member, so as to establish a concentration gradient of the additive in the direction of thickness of the encapsulant resin member and encapsulating a surface of a semiconductor with the resin. The method of applying the electric field to the surface of the encapsulant resin herein can be either a method of applying the electric field from the outside in forced fashion or a method of placing on the encapsulant resin member a charged organic polymer resin member, for example, an organic polymer resin layer having a surface subjected to the corona discharge or plasma discharge treatment to apply the electric field.

As the additive in the encapsulant resin, a polar substance is used when expected to have the concentration gradient, while a nonpolar substance is used when expected to have a uniform concentration distribution.

The encapsulant resin member of the present invention has the additive dissolved therein such that the additive has the concentration gradient in the direction of thickness and is therefore a highly functional encapsulant resin member for a semiconductor. For example, in the case of the solar cell module, when the additive such as an ultraviolet absorbing agent or the like in the encapsulant resin is made to exist in a higher concentration in the vicinity of the surface on the light-incidence side of the encapsulant resin member, whereby deterioration of the encapsulant resin and the photovoltaic element below the encapsulant resin due to ultraviolet rays can be prevented efficiently even if the amount of the additive is relatively small.

The additive like the silane coupling agent in the encapsulant resin member can enhance the adhesive force between the encapsulant resin and the front surface member or between the encapsulant resin and the photovoltaic element when existing in a high concentration in the vicinity of the front surface member or the photovoltaic element. Especially, in the present invention, it is preferred that the concentration of the silane coupling agent in the encapsulant resin member is higher at a location near the front surface member but lower at a location remote from the front surface member, so as to improve the adhesion between the front surface member such as glass sheet and the encapsulant resin member.

Thus, by establishing the concentration gradient of the additive dissolved in the encapsulant resin in the direction of thickness thereof as described above, the aimed function can be achieved by a minimum amount of the additive. It can also eliminate the negative effect that the excess additive is evaporated or decomposed during the laminating operation to remain in the form of bubbles in the module surface. Since the concentration gradient can be established selectively, it also becomes possible to prevent antagonistic action between additives, for example, between a crosslinking agent and an oxidation inhibitor, which is such interaction between the additives as to degrade abilities thereof, and, conversely, to promote synergistic effect, for example, occurring between an ultraviolet absorbing agent and a light stabilizer, which is such interaction as to enhance abilities thereof.

DETAILED DESCRIPTION OF THE PREFERRED EMBODIMENT

Figure 1:
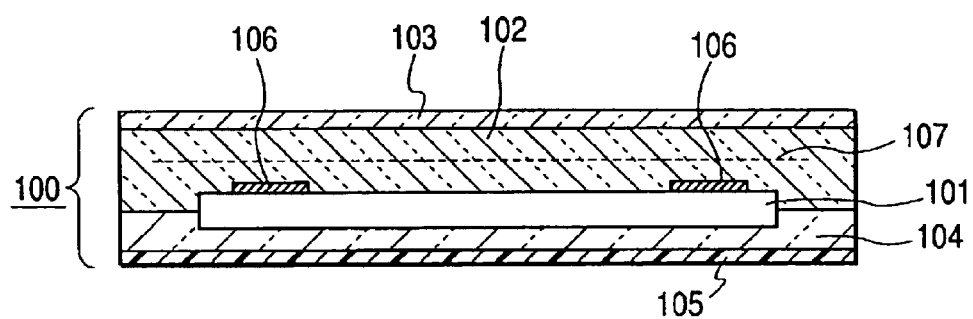
FIG. 1 is a schematic sectional view of a solar cell module of the present invention.

FIG. 1 is a schematic sectional view of a solar cell module (semiconductor device) of the present invention. In FIG. 1, reference numeral 100 designates the solar cell module, 101 a photovoltaic element, 102 a transparent encapsulant resin on the front surface side, 103 a transparent front surface member located in the outermost surface, 104 an encapsulant resin on the back surface side, 105 a back surface member, and 106 current collector electrodes. Light from the outside is incident onto the front surface member 103 and passes therethrough to reach the photovoltaic element 101, and the generated electromotive force is taken out via output terminals (not shown).

The photovoltaic element 101 may be selected according to the purpose from a variety of conventionally known elements including 1) crystalline silicon solar cells, 2) polycrystalline silicon solar cells, 3) amorphous silicon solar cells, 4) copper indium selenide solar cells, 5) compound semiconductor solar cells, and so on.

The encapsulant resin 102 is necessary for covering the unevenness of the surface of the photovoltaic element, for protecting the element from severe external circumstances such as temperature change, humidity, impact, and so on, and for securing the adhesion between the front surface member 103 and the element. Therefore, the encapsulant resin 102 needs to have sufficient weather resistance, adhesion, filling performance, heat resistance, low-temperature resistance, and impact resistance. Resins satisfying these demands include polyolefin base resins such as ethylene-vinyl acetate copolymers (EVA), ethylene-methyl acrylate copolymers (EMA), ethylene-ethyl acrylate copolymers (EEA), polyvinyl butyral resins, and the like, urethane resins, silicone resins, fluororesins, and so on. Among them, the EVA copolymers are preferably used, because they have well-balanced physical properties for the solar cells. It is also desirable to crosslink the encapsulant resin 102 so as to enhance the heat resistance, and as a consequence, deformation or creep can be prevented under use at high temperatures.

In the case of the EVA copolymers, it is ordinary practice to crosslink them with a crosslinking agent such as organic peroxide or the like. Crosslinking with the organic peroxide is effected in such a manner that free radicals evolving from the organic peroxide withdraw hydrogen or halogen atoms from the resin to create C—C bonds. Activating methods of the organic peroxide conventionally known are thermal decomposition, redox decomposition, and ion decomposition. In general, the thermal decomposition method is employed preferably. Specific examples of chemical structure of the organic peroxide include hydroperoxide, dialkyl (allyl) peroxide, diacyl peroxide, peroxy ketal, peroxy ester, peroxy carbonate, ketone peroxide, and so on. The additive amount of the organic peroxide is 0.5 to 5 parts by weight relative to 100 parts by weight of the encapsulant resin.

In the lamination the above-stated organic peroxide is made to be dissolved in the encapsulant resin and the crosslinking and thermal compression are effected under application of pressure and heat in vacuum. The crosslinking condition of the encapsulant resin can be determined with consideration to thermal decomposition temperature characteristics of the organic peroxide. In general, the application of heat and pressure are stopped at temperature and time at which thermal decomposition proceeds up to 90% and more preferably up to 95% or more. The crosslinking of the encapsulant resin can be checked by measuring gel percentage, which is a rate of gelled resin in the encapsulant resin. In order to prevent deformation of the encapsulant resin at high temperatures, it is desirable to crosslink the resin so that the gel percentage is not less than 70 wt %.

For efficient progress of the above crosslinking reaction, it is also possible to add triallyl isocyanurate (TAIC) or the like as a crosslinking assistant, in combination with the aforementioned crosslinking agent. The additive amount of the crosslinking assistant can be not more than the additive amount of the crosslinking agent; for example, the additive amount of the crosslinking assistant is not more than 5 parts by weight relative to 100 parts by weight of the encapsulant resin.

In order to enhance the weather resistance of the encapsulant resin and the layers below the encapsulant resin, it is also preferable to dissolve an ultraviolet absorbing agent. Among the ultraviolet absorbing agents, it is particularly preferable to use a low-volatile ultraviolet absorbing agent with consideration to operating circumstances of the solar cell module. Specific examples include various organic compounds such as salicylic acid base compounds, benzophenone base compounds, benzotriazole base compounds, and cyanoacrylate base compounds.

If a light stabilizer is also added in addition to the ultraviolet absorbing agent, the encapsulant resin can be obtained with a stabler property against light. Typical light stabilizers are hindered amine base light stabilizers. The hindered amine base light stabilizers do not absorb ultraviolet rays, unlike the ultraviolet absorbing agents. When used together with the ultraviolet absorbing agent, however, they demonstrate the remarkable synergistic effect that the functions of the ultraviolet absorbing agent and the light stabilizer both can be maintained over a long period. It is a matter of course that other light stabilizers than the hindered amine base light stabilizers may also be used. Since the hindered amine base light stabilizers do not color the encapsulant resin, they are preferred light stabilizers when the encapsulant resin is expected to have a high light-transmittancy.

The additive amount of the ultraviolet absorbing agent and the light stabilizer is preferably each in the range of 0.1 to 1.0 wt % and more preferably in the range of 0.05 to 1.0 wt % on the basis of the encapsulant resin.

Further, where the solar cell module is expected to be used under severe circumstances, it is preferable to increase the adhesive strength between the encapsulant resin and the photovoltaic element or the front surface member. The adhesive strength can be improved by adding a silane coupling agent or an organic titanate compound as an adhesion improver to the encapsulant resin. The additive amount of the adhesion improver is preferably 0.1 to 3 parts by weight and more preferably 0.25 to 1 part by weight relative to 100 parts by weight of the encapsulant resin. Moreover, an oxidation inhibitor may also be added for improving the heat resistance and thermal workability of the encapsulant resin. The chemical structure of the oxidation inhibitor is of the monophenol type, the bisphenol type, the polymer phenol type, the sulfur type, or the phosphoric acid type. The additive amount of the oxidation inhibitor is preferably 0.05 to 1.0 wt % on the basis of the encapsulant resin.

Since the front surface member 103 used in the present invention is located in the outermost surface layer of the solar cell module, it needs to have the performance for assuring long-term reliability in outdoor exposure of the solar cell module, including the transparency, weather resistance, pollution resistance, mechanical strength, and so on. Materials suitably applicable in the present invention include low iron tempered glass (i.e., tempered glass with a low iron content), fluororesin films, acrylic resin films, and so on. Particularly, in the present invention, the low iron tempered glass is preferably used as a front surface member of the solar cell module, because it has high transparency and so high impact resistance as to resist breakage.

In the present invention, when the module is expected to have lightweight and flexible properties, it is also preferable to use a resin film (organic polymer resin) as a front surface member. Among such resin films, the fluororesin films are preferred members because of their excellent weather resistance and pollution resistance. Specifically, there can be included, for example, polyvinylidene fluoride resins, polyvinyl fluoride resins, tetrafluoroethylene-ethylene copolymers, and so on. It is preferable to use the polyvinylidene fluoride resins among them for the purpose of enhancing the weather resistance. Further, it is also preferable to use the tetrafluoroethylene-ethylene copolymers for the purposes of enhancing the weather resistance and mechanical strength and achieving high transparency.

When the resin film (surface resin film) is used as the front surface member, the thickness of the film is preferably large to some extent to be enough to secure the mechanical strength. Specifically, the thickness of the film is preferably 20 to 200 $\mu$m and more preferably 30 to 100 $\mu$m.

For increasing the adhesion to the encapsulant resin, it is desirable to carry out a surface treatment such as a corona discharge treatment or a plasma discharge treatment or the like for the surface resin film. As a consequence, the concentration gradients of the additives can be obtained in the encapsulant resin and the adhesion of the surface resin film can also be enhanced.

Further, when an electric field is applied to the encapsulant resin member, the concentration gradients of the additives dissolved in the encapsulant resin change gradually. This method is a preferred method, particularly, when delicate concentration gradients are expected.

When one encapsulant resin member is obtained by bonding a first encapsulant resin member having a large amount of an additive dissolved therein, to a second encapsulant resin member, the additive can have a substantial concentration gradient in the obtained encapsulant resin member. This method is a preferred method, particularly, when the concentration gradient is expected to be substantiated in the encapsulant within short time.

The present invention can be applied for the purpose of encapsulating (sealing) a photoelectric conversion element with the encapsulant resin having the additive dissolved therein with the concentration gradient and may also be applied for the purpose of encapsulating a semiconductor element constituting a semiconductor device such as a thin film transistor, a diode, or the like, for example.

In the specification and claims, the expression that an additive is dissolved in the encapsulant resin means that the additive is substantially not precipitated in the encapsulant resin. In addition, in the case of the encapsulant resin for encapsulating the photovoltaic element, the encapsulant resin is so transparent as not to lower its transparency even if the additive is dissolved therein.

Further, the back surface encapsulant resin 104 is provided for the purpose of bonding the photovoltaic element 101 to the back surface member 105. A preferred material for the back encapsulant resin 104 is one that can secure sufficient adhesion to an electroconductive substrate, that has excellent long-term durability, that can resist thermal expansion and contraction, and that has flexibility. Suitably applicable materials include hot melt materials such as EVA, polyvinyl butyral, and the like, two sided resin-coated tape, epoxy adhesives having flexibility, and so on. Particularly, it is preferable to use the same material as the front surface encapsulant resin, for example, to use the crosslinked EVA described above for the back surface, which can enhance the adhesion to the encapsulant resin and which can simplify the production process remarkably.

The back surface member 105 is necessary for maintaining electrical insulation between the electroconductive substrate of the photovoltaic element 101 and the outside. A preferred material is one that can secure sufficient electrical insulation to the electroconductive substrate, that has excellent long-term durability, that can resist thermal expansion and contraction, and that has flexibility. Materials that can suitably be used in a film shape include nylon and polyethylene terephthalate.

A reinforcing sheet (not shown) may be attached to the outside of the back surface member in order to increase the mechanical strength of the solar cell module or in order to prevent distortion and warpage due to the temperature change. This reinforcing sheet can also be a base material of a roof-material-integrated or construction-material-integrated solar cell module. Preferred materials are steel sheets, plastic sheets, and FRP (fiber reinforced plastic) sheets.

Described below is a method for forming the solar cell module using the photovoltaic element, encapsulant resins, front surface member, and back surface member described above.

A preferred method for covering the light receiving surface of the photovoltaic element with the front surface encapsulant resin 102 and front surface member 103 is a method for preparing the encapsulant resin molded in a sheet shape and thermally compressing it onto the element. Specifically, the encapsulant resin sheet is interposed between the photovoltaic element and the front surface member and they are thermally compressed to form a solar cell module. Further, in the step of producing the sheet of the encapsulant resin or in the step of thermally compressing the element and the front surface member with the encapsulant resin, an electric field is applied to the encapsulant resin sheet to effect electrophoresis of a polar additive in the encapsulant resin, thereby establishing the concentration gradient in the direction of thickness of the encapsulant resin. The heating temperature and heating time during the compression are determined with reference to the temperature and time at which the crosslinking reaction proceeds sufficiently. The back surface is also covered by use of the back surface member and back surface encapsulant by a method similar to the above. In this case, particularly, it is possible to use the same material for the front surface encapsulant resin and the back surface encapsulant resin and thereby to effect the crosslinking and thermal compression simultaneously.

A method of the thermal compression can be a vacuum thermocompression method conventionally known. The vacuum thermocompression method is of either a double vacuum chamber system or a single vacuum chamber system, and an example of the single vacuum chamber system will be described referring to FIGS. 1 and 3.

First, the components including the front surface member 103, front encapsulant resin 102, photovoltaic element 101, back encapsulant resin 104, and back surface member 105 are stacked to form a solar cell module stack 100, as illustrated in FIG. 1. On this occasion, nonwoven fabric of glass fiber 107 may also be used for the reason of assisting exhaust of air from spaces between the components and for the reason of preventing EVA from melting to flow out from the edge of the module. Specifically, this glass fiber non-woven fabric is laid on the surface encapsulant resin 102 and they are heated to make the fabric impregnated with EVA, whereby the nonwoven fabric can be used as a reinforcing material for EVA. In this case, particularly, when the front surface member is of a film shape, the glass fiber nonwoven fabric 107 can also be utilized as a reinforcing material for EVA, which also presents a concomitant effect that it becomes hard for a flaw of the surface to propagate to the element.

Figure 3:
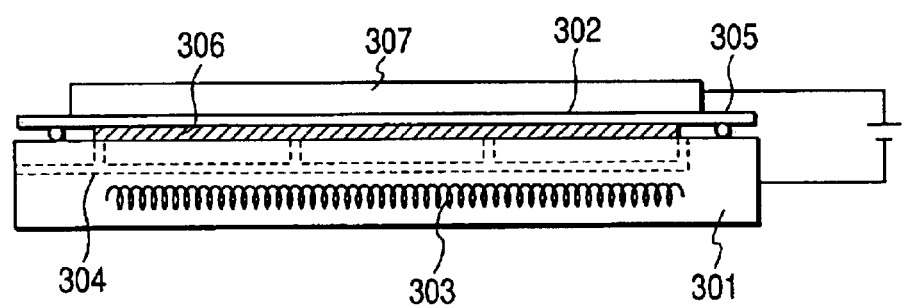
FIG. 3 is an example of a schematic sectional view of a laminating apparatus of a single vacuum chamber system for producing a semiconductor element of the present invention.

The step of laminating the stack 100 described above will be described next using FIG. 3. FIG. 3 is a view which schematically shows a laminating apparatus of the single vacuum chamber system and the stack placed therein. The stack 306 is placed on a plate 301 and a silicone rubber sheet 302 is overlaid thereon. After this step, the stack is laminated by the following steps.

(1) With exhaust through exhaust port 304 of the plate, the stack is compressed throughout the entire surface and uniformly by the silicone rubber sheet 302. At this time, air is eliminated from the spaces between the components, described above. In the figure, reference numeral 305 designates an O-ring.

(2) The plate 301 is heated by heater a 303 up to the temperature at which EVA melts.

(3) An electric field is applied between an electrode 307 provided on the silicone rubber sheet, and the plate 301. At this time the polar additive is subject to electrophoresis in the front surface encapsulant resin to have a concentration gradient.

(4) The plate is heated up to the temperature at which EVA undergoes the crosslinking reaction, and the temperature is maintained until the crosslinking has completed.

(5) After cooling, the laminate 306 is taken out.

During the above steps the degree of the vacuum in the space where the stack is present is desirably not more than 700 Pa, because it permits quick deaeration of air between the components and achievement of a high gelation rate.

The present invention was described above with the example of the solar cell module, but the present invention can also be applied preferably to encapsulation of transistors, diodes, capacitors, or the like, which are not used as photovoltaic elements. In such cases the encapsulant resins may also be opaque resins.

EXAMPLES

Figure 2A:
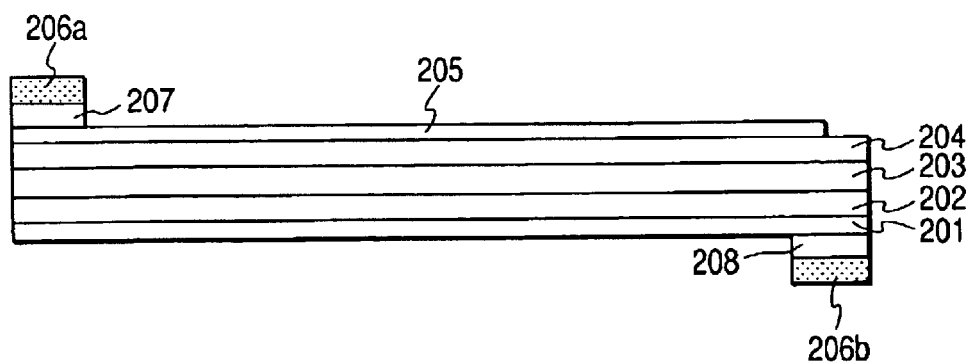
FIG. 2A is a schematic sectional view showing a photovoltaic element and FIG. 2B is an example of a top plan view thereof on the light receiving side.
Figure 2B:
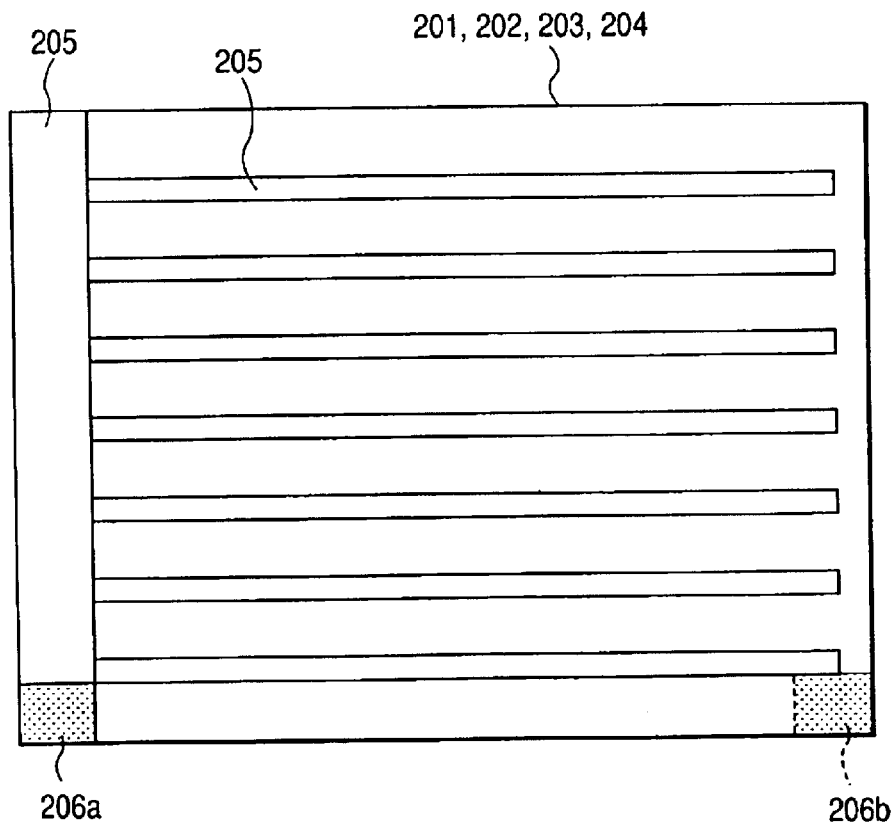

The present invention will be described in detail based on examples. FIG. 2A is a schematic sectional view showing the element part of a photovoltaic element that can be produced according to the present invention and FIG. 2B is an example of a top plan view thereof on the light receiving side.

Example 1

Preparation of Photovoltaic Element Part

An amorphous silicon (a-Si) solar cell part (photovoltaic element part) was fabricated as follows in the structure illustrated in FIGS. 2A and 2B. Specifically, an Al layer (5000 Å thick) and a ZnO layer (5000 Å thick) were successively formed as a back reflecting layer 202 on a stainless steel substrate 201 as cleaned, by sputtering. Then, by the plasma CVD method, n-type a-Si layers were formed from a mixture gas of $SiH_4$, $PH_3$, and $H_2$, i-type a-Si layers from a mixture gas of $SiH_4$ and $H_2$, and p-type microcrystalline $\mu c$-Si layers from a mixture gas of $SiH_4$, $BF_3$, and $H_2$, thereby forming a tandem type a-Si photoelectric conversion semiconductor layer 203 in the layer structure of n-layer 150

Å thick/i-layer 4000 Å thick/p-layer 100 Å thick/n-layer 100 Å thick/i-layer 800 Å thick/p-layer 100 Å thick. Then a thin film of $In_2O_3$ (700 Å thick) was formed as a transparent conductive layer 204 by evaporating In in an $O_2$ atmosphere by the resistance heating method. After this, a defect eliminating treatment of the photovoltaic element was carried out. Specifically, the photovoltaic element and an electrode plate, which was opposed to the transparent conductive layer of the element, were dipped in an aqueous solution of aluminum chloride controlled so that the electric conductivity thereof was 50 to 70 mS. While keeping the element at the earth, a positive potential of 3.5 V was applied to the electrode plate for two seconds to selectively decompose the transparent conductive layer at shunt portions. This treatment improved the shunt resistance from 1 $k\Omega.cm^2$ to 10 $k\Omega.cm^2$ before the treatment to 50 $k\Omega.cm^2$ to 200 $k\Omega.cm^2$ after the treatment.

In the last step, grid electrodes 205 for collection of electricity were provided. Copper wires having the diameter of 100 μm were laid along lines of copper paste 200 μm wide, formed by screen printing. Then a cream solder was placed on the wires and thereafter the solder was melted to fix the copper wires on the copper paste, thereby forming the collector electrodes. A copper tab as a negative terminal was attached to the stainless steel substrate with stainless solder 208 and a tape of tin foil as a positive terminal was attached to the collector electrodes with conductive paste 207, to form output terminals 206a, 206b, thus obtaining the photovoltaic element.

Formation of Module

The back surface encapsulant resin (integral laminate film of EVA 230 μm thick/PET 100 μm thick/EVA 230 μm thick), the photovoltaic element (amorphous silicon semiconductor), the front surface encapsulant resin (EVA 460 μm thick), the front surface protecting/reinforcing material (glass fiber nonwoven fabric with a basis weight 40 g/$m^2$ prepared by bonding glass fibers of a diameter 10 μm and a length 13 mm with an acrylic binder), and the front surface member (an ethylene-tetrafluoroethylene copolymer (hereinafter referred to as ETFE) film of 50 μm thick) were stacked in this order on the back surface member (a GAL-VALUME steel sheet (trade name of 55% aluminum-zinc alloy coated steel sheet) with a polyester coating 0.4 mm thick). The EVA used herein was one obtained by blending 1.5 parts by weight of 2,5-dimethyl-2,5-bis(t-butylperoxy) hexane as a crosslinking agent, 0.5 part by weight of γ-(2-aminoethyl)aminopropyl-trimethoxysilane as a silane coupling agent, 0.15 part by weight of 2-hydroxy-4-n-octoxybenzophenone as an ultraviolet absorbing agent, 0.1 part by weight of bis(2,2,6,6-tetramethyl-4-piperidyl) sebacate as a light stabilizer, and 0.2 part by weight of tris (mono-nonylphenyl)phosphite as an oxidation inhibitor relative to 100 parts by weight of EVA resin (vinyl acetate content: 33%). The ETFE was subjected to a plasma discharge treatment on the adhesive surface side in order to increase adhesion to the EVA.

This stack was placed with the ETFE film side up on the plate of the laminating apparatus (FIG. 3) of the single vacuum chamber system described above and the silicone rubber sheet 302 and plate-like electrode 307 were overlaid thereon. Then evacuation was effected through the exhaust port of the plate by use of a vacuum pump (not shown) to make the rubber attracted to the plate. After the evacuation was carried on for five minutes in the vacuum of 700 Pa, heating was started by the heater buried in the plate up to 140° C. and thereafter the temperature was maintained for fifteen minutes, thereby bringing about the melting and crosslinking reaction of EVA. During the heating an electric field of 3 kV/mm was applied between the electrode 307 and the plate 301. After that, the heater and the electric field were stopped and the plate was cooled down to about 40° C. by a cooling fan. Then the evacuation was stopped and the solar cell module was taken out.

The solar cell module fabricated according to the above method was evaluated as to the items described hereinafter.

Example 2

The laminating operation was carried out by a method similar to that in Example 1 except that the electric field of 3 kV/mm was applied at the stage of producing the EVA sheet (460 μm thick) as the front surface encapsulant resin and the electric field was not applied between the electrode 307 and the plate 301 during the laminating operation, and the module thus obtained was evaluated.

Example 3

The laminating operation was carried out by a method similar to that in Example 1 except that a first EVA resin sheet (230 μm thick) containing 1.0 part by eight of the silane coupling agent relative to 100 parts by weight of EVA and not containing an ultraviolet absorbing agent was placed on the photoelectric conversion element part, a second EVA resin sheet (230 μm thick) containing 0.3 part by weight of the ultraviolet absorbing agent over 100 parts by weight of EVA and not containing a silane coupling agent was overlaid on the first sheet, these two resin sheets were bonded to form the front surface encapsulant resin, and that the electric field was not applied between the electrode 307 and the plate 301 during the laminating operation, and the module thus obtained was evaluated.

Example 4

The laminating operation was carried out by a method similar to that in Example 1 except that the electric field was not applied between the electrode 307 and the plate 301 during the laminating operation, and the module thus obtained was evaluated.

Example 5

The laminating operation was carried out by a method similar to that in Example 1 except that a polyvinyl fluoride film (50 μm thick, hereinafter referred to as PVF) subjected to the plasma discharge treatment was used in the place of the ETFE as the front surface member, and the module thus obtained was evaluated.

Example 6

The laminating operation was carried out by a method similar to that in Example 1 except that PVF not subjected to the plasma discharge treatment was used in the place of the ETFE as the front surface member, and the module thus obtained was evaluated.

Comparative Example 1

The laminating operation was carried out by a method similar to that in Example 6 except that the PVF was not subjected to the plasma discharge treatment and that the electric field was not applied between the electrode 307 and the plate 301 during the laminating operation, and the module thus obtained was evaluated.

Evaluation Results

The solar cell modules fabricated in the examples and comparative example described above were evaluated for the following items.

(1) Initial Appearance

The appearance of the solar cell modules was evaluated immediately after the laminating operation.
- ⊚: a solar cell module without any problem in appearance
- ○: a solar cell module having a small amount of bubbles left therein but posing no problem in practical use.

(2) Adhesion

Initial adhesive force was evaluated between the encapsulant resin (EVA) and the back surface member.
- ⊚: adhesive force not less than 8 kgf/25 mm
- ○: adhesive force not less than 4 kgf/25 mm but less than 8 kgf/25 mm
- x: adhesive force less than 4 kgf/25 mm.

(3) Weather Resistance

The solar cell modules were put in a sunshine weatherometer, an accelerated weathering test was carried out to perform light irradiation and rainfall cycles for 5000 hours, and then the change was evaluated in the appearance of the solar cell modules.
- ⊚: appearance without any change
- ○: appearance with some change but without any problem in practical use
- x: appearance with peeling off or coloring.

The results are shown in Table 1.

TABLE 1

| | Treatment of front surface member | Electric field | Initial appearance | Adhesion | Weather resistance |
|---|---|---|---|---|---|
| Example 1 | with plasma treatment | applied during lamination | ⊚ | ⊚ | ⊚ |
| Example 2 | with plasma treatment | applied during production of EVA sheet | ⊚ | ⊚ | ⊚ |
| Example 3 | with plasma treatment | not applied | ⊚ | ⊚ | ⊚ |
| Example 4 | with plasma treatment | not applied | ⊚ | ○ | ○ |
| Example 5 | with plasma treatment | applied during lamination | ⊚ | ⊚ | ⊚ |
| Example 6 | without plasma treatment | applied during lamination | ⊚ | ○ | ⊚ |
| Comparative Example 1 | without plasma treatment | not applied | ○ | x | x |

As apparent from Table 1, the comparative example 8 without the concentration gradient of the additives in the thickness direction of the encapsulant resin had low adhesive force, was also inferior in the weather resistance, and showed yellowing of EVA after irradiation of light, because it contained the silane coupling agent and the ultraviolet absorbing agent in the amounts less than those necessary for demonstrating the desired functions. In addition, as to the initial appearance, the comparative example had a small amount of bubbles left in the surface of the module, though they were of a level that posed no problem in practical use.

In contrast, the solar cell modules obtained by applying the electric field to the encapsulant resin during the laminating operation like those in Examples 1, 5, and 6 presented no problem at all, even though the contents of the silane coupling agent and ultraviolet absorbing agent were very small.

Example 2 verified that the same effect was able to be achieved by applying the electric field during production of the EVA resin sheet. This implies that the application of the electric field implemented selective electrophoresis of these additives and they functioned effectively.

As is seen from the solar cell module of Example 3, the like effect was able to be achieved by the stack of the encapsulant resins having the different contents of the additives, without application of the electric field.

As is seen from the solar cell module of Example 4, the electric field was able to be applied to the encapsulant resin only by subjecting the ETFE to the plasma discharge treatment and the effect thereof was of a level that posed no problem in practical use, though weaker than in the case of the electric field being forced to be applied.

According to the present invention, by establishing the concentration gradient of the additive dissolved in the encapsulant resin in the step of producing the encapsulant resin or in the step of encapsulating the semiconductor with the encapsulant resin, the semiconductor device with high adhesion or high weather resistance can be obtained while the amount of the additive used is reduced. Specifically, by stacking at least two types of organic polymer resin sheets or the like containing different contents of additives to form one encapsulant resin member or by applying the electric field to the encapsulant resin member to effect electrophoresis of a polar additive in the encapsulant resin, it is possible to provide the highly functional encapsulant resin member for a semiconductor with the concentration gradient of the additive in the direction of thickness of the encapsulant resin and the semiconductor element having it.

In the case of the solar cell module, the concentration of an additive near the light-incident-side surface of the encapsulant resin or near the surface of the photovoltaic element can be changed selectively according to the function of the additive in the encapsulant resin, whereby the additive can act more effectively.

What is claimed is:

1. A photovoltaic element encapsulated in a stack structure with a front surface member, a front surface encapsulant resin, a back surface encapsulant resin, and a back surface member in an order of the front surface member, the front surface encapsulant resin, the photovoltaic element, the back surface encapsulant resin, and the back surface member, wherein the front surface encapsulant resin comprises a hot-melt polymer resin having an ultraviolet absorbing agent dissolved therein, wherein the dissolved ultraviolet absorbing agent has a concentration gradient in the direction of thickness of the encapsulant resin, and wherein the concentration of the ultraviolet absorbing agent is higher at a location near a light incident surface of the front surface encapsulant resin.

2. The photovoltaic element according to claim 1, further comprising a silane coupling agent dissolved in the encapsulant resin.

3. The photovoltaic element according to claim 2, wherein the silane coupling agent is higher at a location near the photovoltaic element.

4. The photovoltaic element according to claim 2, wherein the concentration of the silane coupling agent is higher at a location in the encapsulant resin near the surface member.

* * * * *

UNITED STATES PATENT AND TRADEMARK OFFICE
CERTIFICATE OF CORRECTION

PATENT NO.    : 6,762,508 B1
DATED         : July 13, 2004
INVENTOR(S)   : Shigeo Kiso et al.

It is certified that error appears in the above-identified patent and that said Letters Patent is hereby corrected as shown below:

Column 6,
Line 65, "two sided" should read -- two-sided --.

Column 8,
Line 27, "subject" should read -- subjected --.

Column 10,
Line 23, "eight" should read -- weight --.

Column 11,
Line 49, "8" should be deleted.

Column 12,
Line 59, "the silane" should read -- the concentration of the silane --.

Signed and Sealed this

Fourth Day of January, 2005

JON W. DUDAS
*Director of the United States Patent and Trademark Office*